(12) United States Patent
Boulestin

(10) Patent No.: US 11,283,441 B2
(45) Date of Patent: Mar. 22, 2022

(54) DEVICE FOR CHARGING AND DISCHARGING A CAPACITOR

(71) Applicant: STMicroelectronics (Grenoble 2) SAS, Grenoble (FR)

(72) Inventor: Renald Boulestin, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 17/226,535

(22) Filed: Apr. 9, 2021

(65) Prior Publication Data
US 2021/0344339 A1 Nov. 4, 2021

(30) Foreign Application Priority Data

Apr. 30, 2020 (FR) .................................... 2004327

(51) Int. Cl.
*H02M 1/15* (2006.01)
*H02M 1/42* (2007.01)
*H03K 3/00* (2006.01)
*G05F 1/563* (2006.01)
*H03K 17/687* (2006.01)

(52) U.S. Cl.
CPC .................................. *H03K 17/687* (2013.01)

(58) Field of Classification Search
None
See application file for complete search history.

(56) References Cited

U.S. PATENT DOCUMENTS

| 5,367,210 A | 11/1994 | Lipp |
| 9,954,460 B2 * | 4/2018 | Chang ..................... H02M 1/42 |
| 10,622,989 B2 * | 4/2020 | Mori .................... H03K 17/161 |

FOREIGN PATENT DOCUMENTS

| EP | 3627703 A1 | 3/2020 |
| GB | 2356304 A | 5/2001 |

OTHER PUBLICATIONS

INPI Search Report and Written Opinion for FR 2004327 dated Dec. 22, 2020 (9 pages).

* cited by examiner

*Primary Examiner* — Kenneth B Wells
(74) *Attorney, Agent, or Firm* — Crowe & Dunlevy

(57) ABSTRACT

A device operate by alternating between first and second phases of operation. The device includes a first transistor and a first circuit. The first circuit operates to: couple a first conduction terminal of the first transistor to an output node of the device and a second conduction terminal of the first transistor to a first node of application of a potential during each first phase; and couple the first terminal of the first transistor to a second node of application of a potential and the second conduction terminal of the first transistor to the output node during each second phase of operation.

19 Claims, 6 Drawing Sheets

DEVICE FOR CHARGING AND DISCHARGING A CAPACITOR

PRIORITY CLAIM

This application claims the priority benefit of French Application for Patent No. 2004327, filed on Apr. 30, 2020, the content of which is hereby incorporated by reference in its entirety to the maximum extent allowable by law.

TECHNICAL FIELD

The present disclosure relates generally to electronic circuits and, more specifically, to electronic devices for alternately supplying a current to a node and drawing a current from the node, for example for charging and discharging a capacitor connected to the node.

BACKGROUND

Electronic devices for charging and discharging a capacitor are known. These devices are configured to alternately supply a current to or draw a current from the capacitor to which they are connected. For this purpose, these devices comprise a first transistor configured to supply current to the capacitor, and a second transistor configured to draw current from the capacitor.

Such devices are, for example, used as the driver circuit of a MOS power transistor, i.e., a MOS transistor configured to support the flow of power currents between its drain and its source the values of which run from 1 A, preferably 2 A, up to 300 A or higher. In order to turn the MOS power transistor alternately on or off, the intrinsic capacitors (drain-gate and source-gate) are alternately charged and discharged by a driver device connected to the gate of the transistor.

These known devices suffer from various drawbacks. In particular, when the currents supplied and drawn by these devices are in the order of one or several hundreds of milliamperes, their first and second transistors are cumbersome, so that, as a result, these devices are cumbersome.

There is a need in the art to address all or some of the drawbacks of the known devices described in the foregoing.

SUMMARY

In an embodiment, a device is configured to supply a current to a node and draw a current from the node, in particular for alternately charging and discharging capacitors, for example of a MOS power transistor, which is less cumbersome than the known devices described above.

One embodiment provides a device configured to supply a current to a node and draw a current from the node, in particular for alternately charging and discharging capacitors, for example of a MOS power transistor, which is compatible with control circuits of the known devices described in the foregoing.

One embodiment provides a device configured to operate by alternating between first and second phases of operation, the device comprising: a first transistor; and a first circuit configured to: couple a first conduction terminal of the first transistor to an output node of the device and couple a second conduction terminal of the first transistor to a first node of application of a potential during each first phase; and couple the first terminal of the first transistor to a second node of application of a potential and couple the second conduction terminal of the first transistor to the output node during each second phase of operation.

According to one embodiment, the first circuit comprises: a first first-phase switch connected between the first terminal of the first transistor and the output node; a second first-phase switch connected between the second terminal of the first transistor and the first node; a first second-phase switch connected between the first terminal of the first transistor and the second node; and a second second-phase switch connected between the second terminal of the first transistor and the output node.

According to one embodiment, the first transistor and the switches of the first circuit are MOS transistors, and, for a given technology, a channel length of the first transistor is greater, preferably at least 4 times greater, than a minimum channel length of said given technology, the channel length of the switches of the first circuit being preferably equal to said minimum length.

According to one embodiment, the device further comprises: a second transistor having a first conduction terminal and a control terminal that are connected with each other; a third transistor having a first conduction terminal and a control terminal that are connected with each other; a second circuit configured to couple, during each first phase of operation, a control terminal of the first transistor to a first terminal of a source of a first current, via the first terminal of the second transistor, a second terminal of the source of the first current being coupled, preferably connected, to the second node; and a third circuit configured to couple, during each second phase of operation, the control terminal of the first transistor to the first terminal of the source of the first current via the first terminal of the third transistor.

According to one embodiment, the device further comprises: a second transistor having a first conduction terminal and a control terminal that are connected with each other; a third transistor having a first conduction terminal and a control terminal that are connected with each other; a second circuit configured to couple, during each first phase of operation, a control terminal of the first transistor to a first terminal of a source of a first current, via the first terminal of the second transistor, a second terminal of the source of the first current being coupled, preferably connected, to the second node; and a third circuit configured to couple, during each second phase of operation, the control terminal of the first transistor to a first terminal of a source of a second current, via the first terminal of the third transistor, a second terminal of the source of the second current being coupled, preferably connected, to the second node, the second current being preferably equal to the first current.

According to one embodiment: the second circuit comprises a first first-phase switch configured to couple, during each first phase of operation, the control terminal of the first transistor to the first terminal of the source of the first current, via the first terminal of the second transistor, a terminal of said first first-phase switch being coupled, preferably connected, to the control terminal of the second transistor; and the third circuit comprises a first second-phase switch configured to couple, during each second phase of operation, the control terminal of the first transistor to the first terminal of the source of the second current, via the first terminal of the third transistor, a terminal of said first first-phase switch being coupled, preferably connected, to the control terminal of the third transistor.

According to one embodiment: the second circuit is further configured to couple a second conduction terminal of the second transistor to the first node during each first phase of operation; and/or the third circuit is further configured to couple a second conduction terminal of the third transistor to the output node during each second phase of operation.

According to one embodiment: the second circuit further comprises a second first-phase switch connected between the second conduction terminal of the second transistor and the first node; and/or the third circuit further comprises a second second-phase switch connected between the second terminal of the third transistor and the output node.

According to one embodiment, the ratio of the channel width to the channel length of the first transistor is equal to N times the ratio of the channel width to the channel length of the second transistor and to M times the ratio of the channel width to the channel length of the third transistor, with N and M greater than or equal to 10, M preferably being equal to N.

According to one embodiment, the device comprises a current mirror, an output branch of the current mirror comprising the first transistor and the first circuit.

According to one embodiment, an input branch of the current mirror comprises the second transistor and the second circuit during each first phase of operation, said input branch comprising the third transistor and the third circuit during each second phase of operation.

According to one embodiment, the device is configured to draw a first output current from the output node during each first phase, and supply a second output current to the output node during each second phase.

According to one embodiment, the device further comprises a control circuit configured to: control the closing of the first-phase switches and the opening of the second-phase switches during each first phase; and control the closing of the second-phase switches and the opening of the first-phase switches during each second phase.

According to one embodiment, the device is configured for charging and discharging gate-source and gate-drain capacitors of a MOS power transistor the gate of which is intended to be connected to the output node.

One embodiment provides an integrated circuit comprising the described device.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the various applications in which a device can be provided that is configured to alternately draw a current from a node, for example connected to a gate of a MOS power transistor, and supply a current to this node have not been described, the described embodiments and variants being compatible with such known applications.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The inventor proposes here to exploit the fact that, in the known devices described in the foregoing that are configured to alternately supply a current to a node and draw a current from this node, for example a node connected to a gate of a MOS power transistor, the first and second transistors configured for respectively supplying and drawing the current are not used at the same time.

More specifically, the inventor proposes here to retain only one of these first and second transistors. The inventor proposes, furthermore, to provide a circuit configured so that this transistor is connected between the output node of the device and a node of application of a, for example low, first potential when current is drawn from the output node, and between the output node and a node of application of a, for example high, second potential when current is supplied to the output node, the transistor and this circuit forming, at least partly, an output branch of a current mirror.

Figure 1:
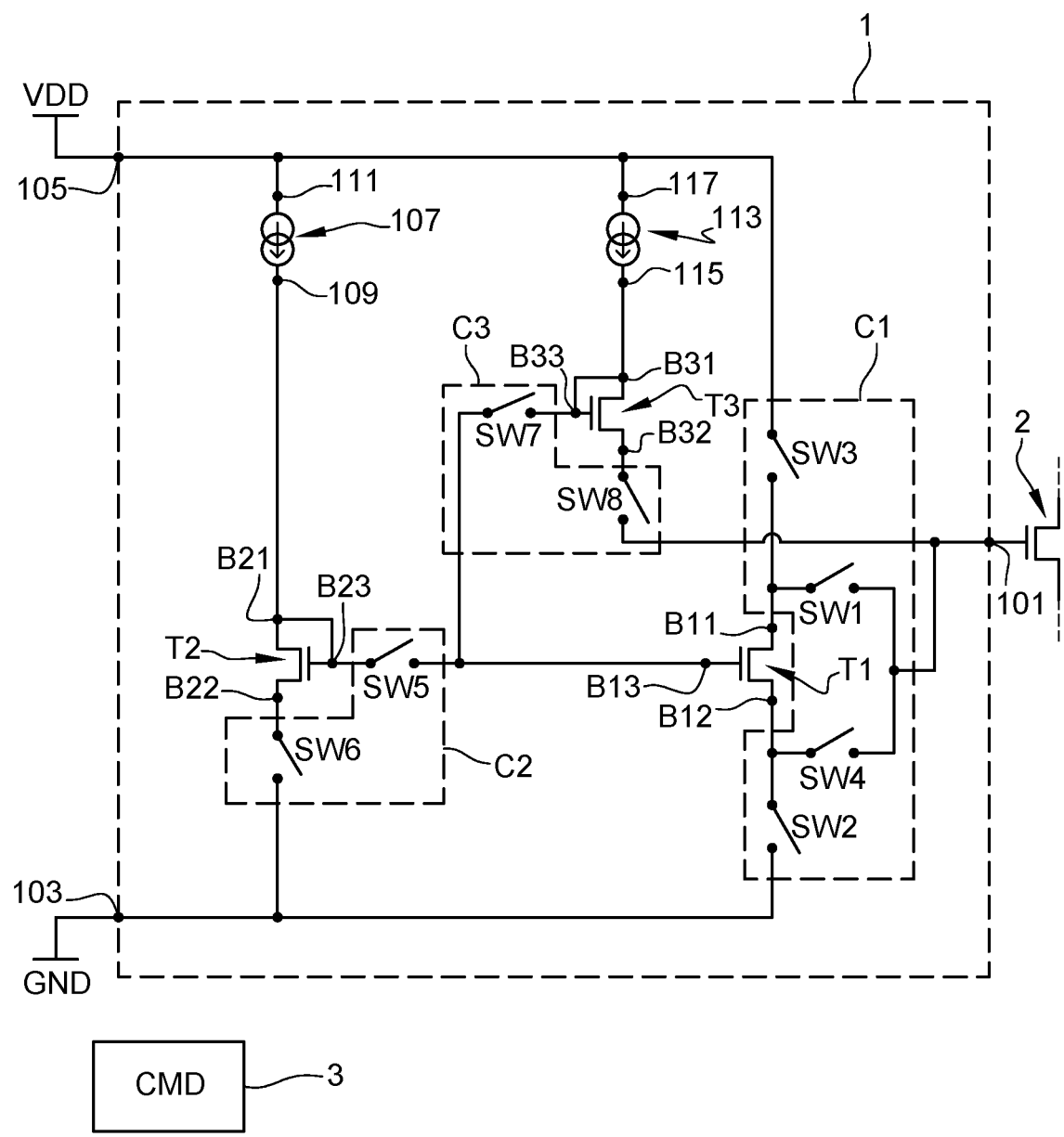
FIG. 1 illustrates, schematically and in the form of a circuit, an embodiment of a device.

FIG. 1 illustrates, schematically and in the form of a circuit, an embodiment of a device 1 as proposed.

In the example of FIG. 1, the device 1 (delimited by a dotted frame in FIG. 1) is used as the driver circuit of a MOS power transistor 2, for example of an N-channel MOS transistor 2. Although this is not illustrated in FIG. 1, the conduction terminals of the transistor 2, i.e., its drain and its source, are respectively indirectly coupled to a first potential, for example a supply potential VDD, and coupled to a second potential, for example a reference potential, typically the ground GND. The control terminal of the transistor 2, i.e., its gate electrode, more generally called gate, is coupled, preferably connected, to an output node 101 of the device 1.

However, the embodiments and variants of devices that will be described are not limited to this example of usage, these devices potentially being used in other applications in which a current is alternately drawn from a node or supplied to this node, in particular when this current is in the order of one or several hundreds of milliamperes.

The device 1 is configured to operate by alternating first phases of operation, for example phases where a first output current is drawn from the node 101 by the device 1, for example for discharging the intrinsic capacitors of the transistor 2, and second phases of operation, for example phases where a second output current is supplied to the node 101 by the device 1, for example for charging the intrinsic capacitors of the transistor 2.

The device 1 comprises a first transistor T1, in this example a MOS transistor, for example an N-channel MOS transistor.

The device 1 further comprises a first circuit C1 (delimited by a dotted line in FIG. 1). The first circuit C1 is associated with the transistor T1.

The first circuit C1 is configured so that, during each first phase of operation of the device 1: a first conduction terminal B11, for example the drain, of the transistor T1 is coupled to the node 101; and a second conduction terminal B12, for example the source, of the transistor T1 is coupled to a node 103 of application of the second potential GND.

The first circuit C1 is further configured so that, during each second phase of operation of the device 1: the first conduction terminal B11 of the transistor T1 is coupled to a node 105 of application of the first potential VDD; and the second conduction terminal B12 of the transistor T1 is coupled to the node 101.

The circuit C1 is further configured so that, during each first phase and during each second phase, the circuit C1 is deprived of a conductive pathway without the transistor T1 between the node 103 and the node 105, between the node 103 and the node 101, and between the node 105 and the node 101. In other words, the circuit C1 is configured to: disconnect the terminal B11 from the node 105 and the terminal B12 from the node 101 during each first phase; and disconnect the terminal B11 from the node 101 and the terminal B12 from the node 103 during each second phase.

In the following description, a switch intended to be closed during each first phase is called a first-phase switch and a switch intended to be closed during each second phase is called a second-phase switch. Moreover, a first-phase, respectively a second-phase, switch, is intended to be opened during each second phase, respectively during each first phase.

According to an embodiment as illustrated by FIG. 1, the circuit C1 comprises: a first first-phase switch SW1 connected respectively to the terminal B11 of the transistor T1 and to the node 101; a second first-phase switch SW2 connected respectively to the terminal B12 of the transistor T1 and to the node 103; a first second-phase switch SW3 connected between the terminal B11 of the transistor T1 and the node 105; and a second second-phase switch SW4 connected between the terminal B12 of the transistor T1 and the node 101.

The device 1 further comprises a current mirror. The output branch of the current mirror comprises, preferably is constituted by, the transistor T1 and the circuit C1.

Preferably, it is provided that the current mirror is configured so that the current in its output branch corresponds to the current in its input branch multiplied by a factor greater than 1, preferably greater than 10, for example equal to 50, even equal to 100. By this means, it is in particular possible for the current in the output branch of the current mirror, thus at the node 101, to have a value that is high enough for the target application, for example in the order of one or several hundreds of milliamperes.

An example application is considered in which it is desirable for the currents respectively supplied to the node 101 and drawn from the node 101 by the device 1 to have values that are as precise as possible. The channel length of the MOS transistor T1, measured between its drain and source areas, is preferably greater than a minimum channel length of a technology in question used to fabricate the integrated circuit, for example at least 4 times greater than this minimum channel length, to limit the manufacturing dispersions, which are maximum when the channel length is equal to the minimal channel length of the technology in question.

Still as an example, the case of an application is considered in which it is desirable that the currents respectively supplied to the node 101 and drawn from the node 101 by the device 1 have values that are as precise as possible. When the switches SW1, SW2, SW3, SW4 of the circuit C1 are implemented by transistors of the same technology as the transistor T1, the manufacturing dispersions on these transistors SW1, SW2, SW3, SW4 have a negligible influence on the value of the current in the output branch of the current mirror. At least one of the dimensions of these transistors SW1, SW2, SW3, SW4 determining the maximum current flowing therein can thus be equal to the corresponding minimum dimension of the technology in question. Preferably, the channel length of the transistors SW1, SW2, SW3, SW4 is substantially equal, or equal, to the minimum channel length in the technology in question.

It is understood from the two above paragraphs that the transistors SW1, SW2, SW3 and SW4 can occupy a much smaller surface area than that occupied by the transistor T1, for example at least 16 times smaller than that occupied by a transistor T1 having a channel length equal to four times the minimal channel length of the technology in question, all while making it possible for a considerable current, for example of one or several hundreds of milliamperes, to flow in the output branch of the current mirror and at the node 101. Thus, compared to a known device comprising two transistors with the same dimensions as the transistor T1 but deprived of the circuit C1, the device 1 occupies a reduced surface area, in particular when the current drawn from the node 101 and the current supplied to the node 101 are considerable.

According to an embodiment depicted in FIG. 1, the device is configured so that the input branch of the current mirror comprises a second transistor T2 of the device 1 during each first phase of operation, and a third transistor T3 of the device 1 during each second phase of operation. More specifically, during each first phase of operation, the transistor T1 is mirror-assembled with the transistor T2, and, during each second phase of operation, the transistor T1 is mirror-assembled with the transistor T3.

The transistor T2 is, for example, a MOS transistor, for example an N-channel MOS transistor. The transistor T2 has a first conduction terminal B21, for example its drain, connected to its control terminal B23. Similarly, the transistor T3 is, for example, a MOS transistor, for example an N-channel MOS transistor. The transistor T3 has a first conduction terminal B31, for example its drain, connected to its control terminal B33.

According to the embodiment depicted in FIG. 1, the device 1 comprises a second circuit C2 and a third circuit C3. The circuit C2 is associated with the transistor T2 and the circuit C3 is associated with the transistor T3.

The circuit C2 is configured, during each first phase, to couple the transistors T1 and T2 as a current mirror. For this purpose, the circuit C2 is configured so that, during each first phase: the first conduction terminal B21 and a second conduction terminal B22, for example the source, of the transistor T2 are coupled respectively to a first terminal 109 of a source 107 of a first current and to the node 103, a second terminal 111 of the source 107 being coupled, preferably connected, to the node 105; and the control terminal B23 of the transistor T2 is coupled to a control terminal B13 of the transistor T1.

In particular, the circuit C2 is configured to couple, during each first phase, the control terminal B13 of the transistor T1 to the terminal 109 of the source 107, via the terminal B21 of the transistor T2. In other words, the circuit C2 is configured, during each first phase, to create a conductive pathway between the terminal 109 and the terminal B13, which comprises the terminal B21 (thus the terminal B23).

Moreover, the circuit C2 is configured to prevent, during each second phase, the transistor T2 from acting on the control terminal B13 of the transistor 1.

In the embodiment depicted in FIG. 1, the terminal B21 is connected to the terminal 109. The circuit C2 is thus configured, during each first phase, to couple the terminal B23 to the terminal B13. The circuit C2 is further configured, during each second phase, to disconnect, or isolate, the terminal B23 from the terminal B13. According to a particular implementation embodiment, the circuit C2 comprises a first first-phase switch SW5 connected between the terminals B23 and B13.

In the embodiment depicted in FIG. 1, optionally, the circuit C2 is configured to couple, during each first phase, the second terminal B22 of the transistor T2 to the node 103. In a complementary manner, the circuit C2 is thus also configured to disconnect, during each second phase, the terminal B22 from the node 103. The provision of such an operation makes it possible to reduce or even eliminate the flow of a leakage current between the nodes 103 and 105 during each second phase, compared to a variant embodiment where the terminal B22 of the transistor T2 is connected to the node 103 and where the terminal B12 of the transistor T2 is connected to the terminal 109. According to a particular implementation embodiment, the circuit comprises an optional second first-phase switch SW6 connected between the terminal B22 and the node 103.

The circuit C3 is configured, during each second phase, to couple the transistors T1 and T3 as a current mirror. For this purpose, the circuit C3 is configured so that, during each second phase: the first conduction terminal B31 and a second conduction terminal B32, for example the source, of the transistor T3 are coupled respectively to a first terminal 115 of a source 113 of a second current, preferably substantially equal, or equal, to the first current, and to the node 103, the second terminal 117 of the source 113 being coupled, preferably connected, to the node 105; and the terminal B33 of the transistor T3 is coupled to the terminal B13 of the transistor T1.

In particular, the circuit C3 is configured to couple, during each second phase, the control terminal B13 of the transistor T1 to the terminal 115 of the source 113, via the terminal B31 of the transistor T3. In other words, the circuit C3 is configured, during each second phase, to create a conductive pathway between the terminal 115 and the terminal B13, which comprises the terminal B31 (thus the terminal B33).

Moreover, the circuit C3 is configured to prevent, during each first phase, the transistor T3 from acting on the control terminal B13 of the transistor T1 and on the output node 101.

In the embodiment depicted in FIG. 1, where the terminal B31 is connected to the terminal 115, the circuit C3 is thus configured, during each second phase, to couple the terminal B33 to the terminal B13. The circuit C3 is further configured, during each first phase, to disconnect, or isolate, the terminal B33 from the terminal B13. According to a particular implementation embodiment, the circuit C3 comprises a first second-phase switch SW7 connected between the terminals B33 and B13.

In the embodiment depicted in FIG. 1, where the terminal B31 is connected to the terminal 115, the circuit C3 is also configured to couple, during each second phase, the terminal B32 of the transistor T3 to the node 101. In a complementary manner, the circuit C3 is configured to isolate, during each first phase, the terminal B32 from the node 101. According to a particular implementation embodiment, the circuit C3 comprises a second second-phase switch SW8 connected between the terminal B32 and the node 101.

In the embodiment depicted in FIG. 1, the current sources 107 and 113 are part of the device 1. In a variant embodiment not shown, one and/or the other of these current sources 107 and 113 can be external to the device 1.

In the embodiment depicted in FIG. 1, a control circuit 3 (CMD) is provided. According to this embodiment, the circuit 3 is external to the device although, as a variant, this circuit 3 can be part of the device 1.

The control circuit 3 is configured to supply a signal indicating to the device 1 the commutations between the first and second phases of operation in a similar manner to the control circuits of the known devices described in the foregoing. The device 1 is thus compatible with these known control circuits. For example, the circuit 3 supplies a binary control signal whose commutations from a first binary state to a second binary state, or respectively from the second binary state to the first binary state, control commutations from a first phase of operation to a second phase of operation, or respectively from a second phase of operation to a first phase of operation.

The circuit 3 controls the circuit C1 and the circuits C2 and C3. According to the particular implementation embodiments described above, the circuit 3 controls the closing of the first-phase switches during each first phase, and the closing of the second-phase switches during each second phase. In a complementary manner, the circuit 3 controls the opening of the second-phase switches during each first phase, and the opening of the first-phase switches during each second phase. For instance, when the first-phase switches and the second-phase switches are implemented by transistors of the same technology as the transistor T1, these switches receive on their control terminals the binary signal supplied by the circuit 3, perhaps complemented by means of one or more inverters.

Figure 2:
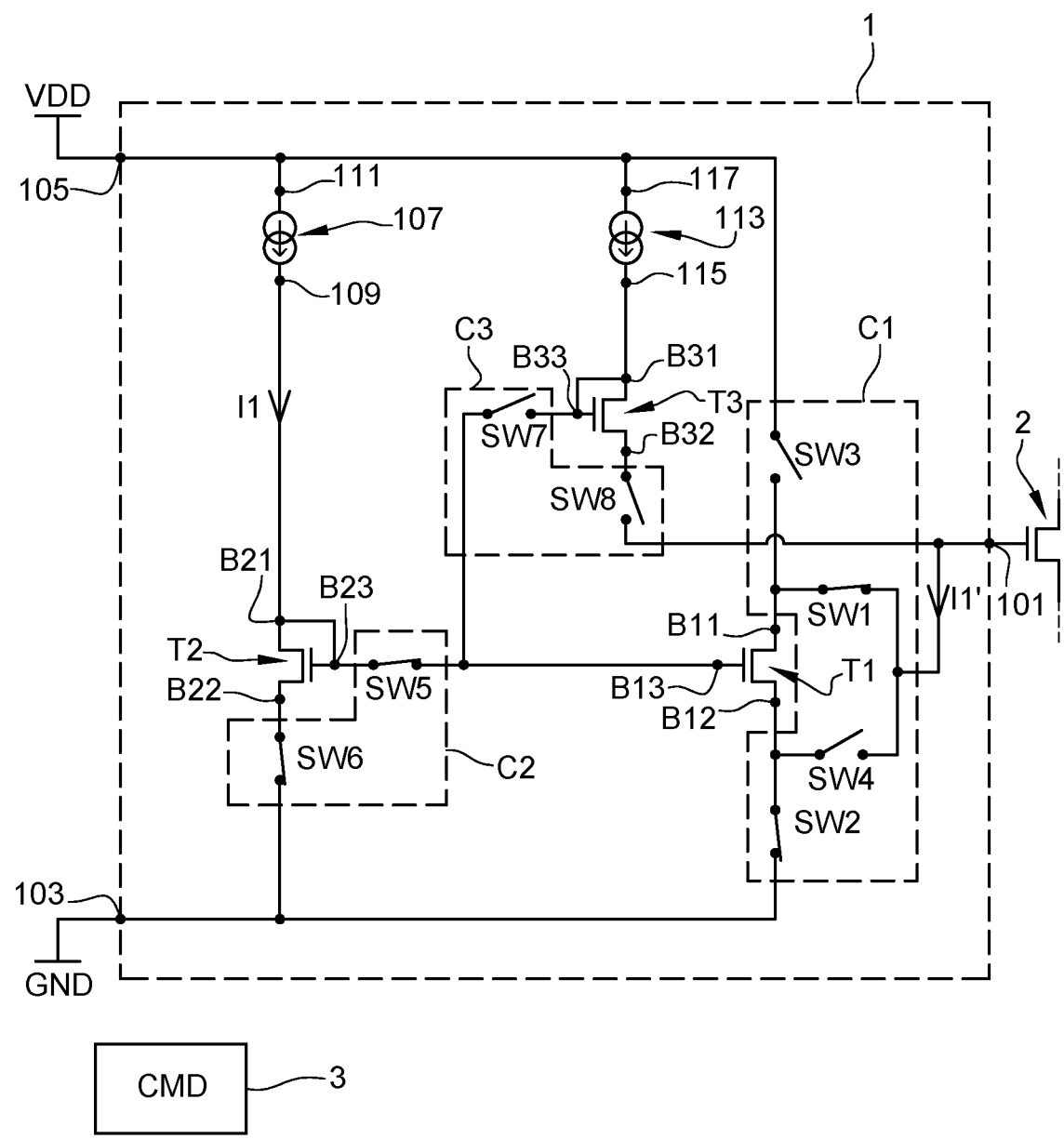
FIG. 2 illustrates, schematically and in the form of a circuit, a first phase of operation of the device of FIG. 1.

FIG. 2 illustrates the device 1 of FIG. 1 during a first phase of operation.

The transistor T1 has its terminals B11 and B12 coupled respectively to the nodes 101 and 103 by the circuit C1, in this embodiment by the respective first-phase switches SW1 and SW2. The transistor T1 also has its terminals B11 and B12 isolated respectively from the nodes 105 and 101 by the circuit C1, in this embodiment by the respective second-phase switches SW3 and SW4.

Moreover, the transistor T2 has its terminal B22 coupled to the node 103 by the circuit C2, in this embodiment by the first-phase switch SW6, and its terminal B23 coupled to the terminal B13 of the transistor T1 by the circuit C2, in this embodiment by the first-phase switch SW5, its terminal B21 being connected to the terminal 109 of the source 107.

In addition, the terminal B13 of the transistor T1 is isolated from the terminal B33 of the transistor T3 by the circuit C3, in this embodiment by the second-phase switch SW7, and the terminal B32 of the transistor T3 is isolated from the node 101 by the circuit C3, in this embodiment by the second-phase switch SW8.

The source 107 delivers a current I1 in the input branch of the current mirror comprising the transistor T2 and the circuit C2, so that, as a result, a current I1' flows in the output branch of the current mirror, from the node 101 toward the node 103. In other words, the current I1' is drawn from the output node 101. The current I1' is equal to N times the current I1, N being the multiplication factor of the current mirror and being determined by the size (width/length) ratios of the transistors T2 and T1. The factor N is greater than 1, preferably greater than 10, for example equal to 50, even to 100.

Figure 3:
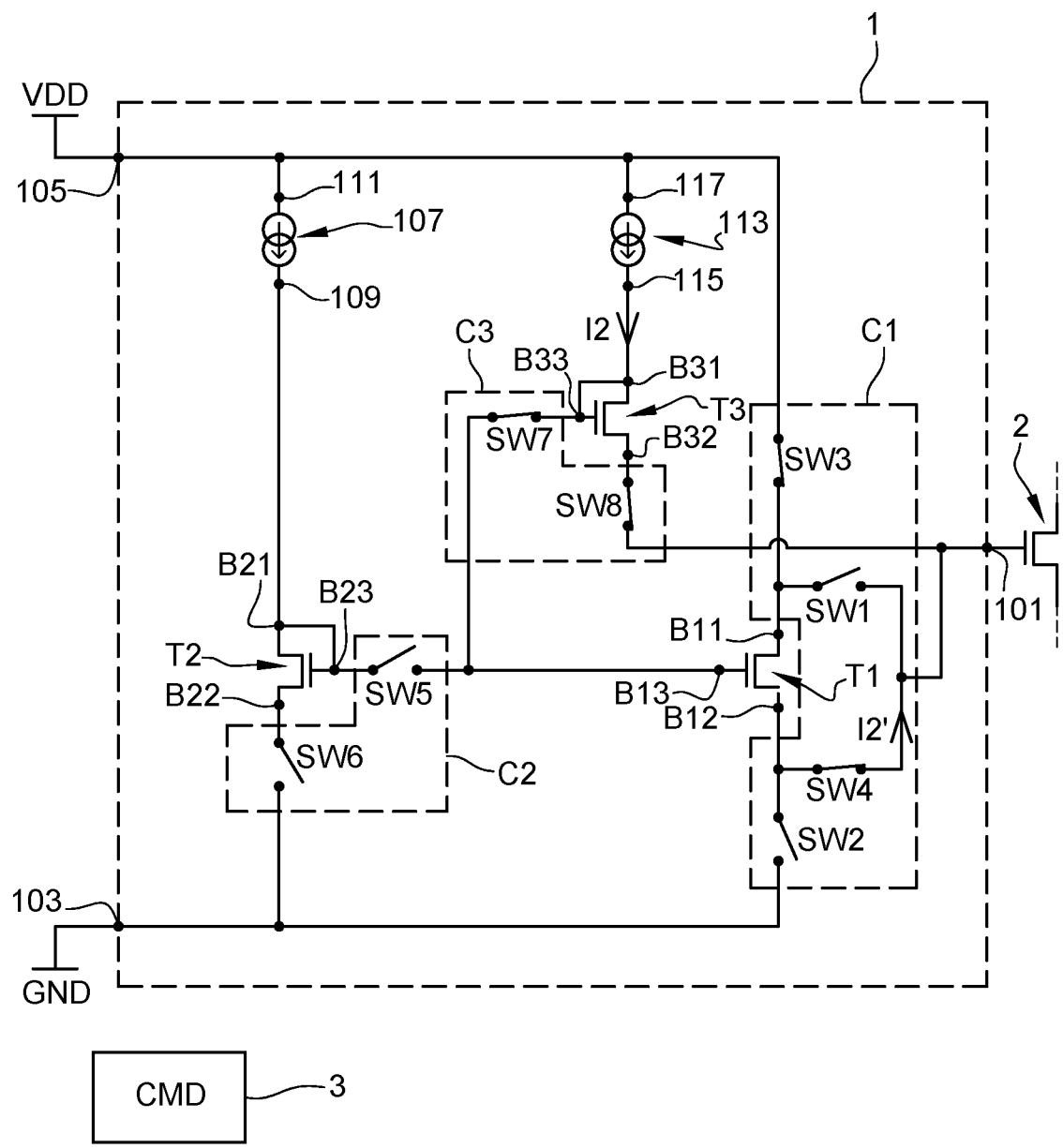
FIG. 3 illustrates, schematically and in the form of a circuit, a second phase of operation of the device of FIG. 1.

FIG. 3 depicts the device 1 of FIG. 1 during a second phase of operation.

The transistor T1 has its terminals B11 and B12 coupled respectively to the nodes 105 and 101 by the circuit C1, in this embodiment by the respective second-phase switches SW3 and SW4. The transistor T1 further has its terminals B11 and B12 isolated respectively from the nodes 101 and 103 by the circuit C1, in this implementation embodiment by the respective first-phase switches SW1 and SW2.

Moreover, the transistor T3 has its terminal B32 coupled to the node 101 by the circuit C3, in this embodiment by the second-phase switch SW8, and its terminal B33 coupled to the terminal B13 of the transistor T1 by the circuit C3, in this embodiment by the second-phase switch SW7, its terminal B31 being connected to the terminal 115 of the source 113.

In addition, the terminal B13 of the transistor T1 is isolated from the terminal B23 of the transistor T2 by the circuit C2, in this embodiment by the first-phase switch SW5, and the terminal B22 of the transistor T2 is isolated from the node 103 by the circuit C2, in this embodiment by the first-phase switch SW6.

The source 113 delivers a current I2 in the input branch of the current mirror comprising the transistor T3 and the circuit C3, so that, as a result, a current I2' flows in the output branch of the current mirror, from the node 105 toward the node 101. In other words, the current I2' is supplied to the output node 101. The current I2' is equal to M times the current I2, M being the multiplication factor of the current mirror and being determined by the size (width/length) ratios of the transistors T3 and T1. The factor M is greater than 1, preferably greater than 10, for example equal to 50, even to 100. Preferably, the current I2 is equal to the current I1, and the factors M and N are equal.

Figure 4:
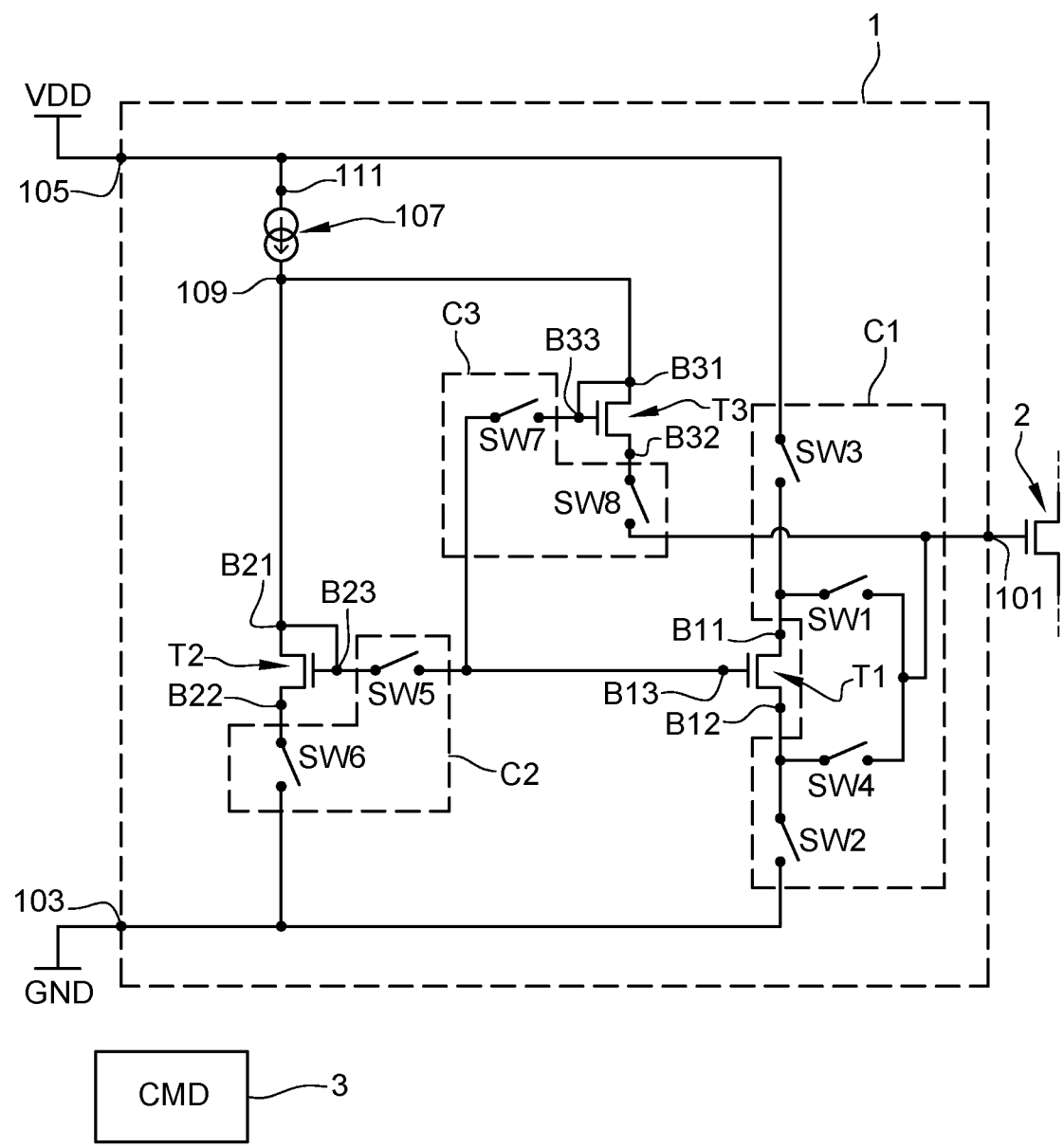
FIG. 4 illustrates, schematically and in the form of a circuit, a variant embodiment of the device of FIG. 1.

FIG. 4 illustrates, schematically and in the form of a circuit, a variant embodiment of the device 1 of FIG. 1. Only the differences between the device 1 of FIG. 4 and that of FIG. 1 are highlighted here.

The device 1 of FIG. 4 differs from that of FIG. 1 in that the source 113 is combined with the source 107, the source 107 potentially being part of the device 1 as illustrated in FIG. 4, or else external to the latter.

Compare to the device 1 of FIG. 1, in which, for example, the current source 107 corresponds to a first MOS transistor mirror-assembled with a second MOS transistor and the current source 113 to a third MOS transistor mirror-assembled with the second MOS transistor, the device 1 of FIG. 4 make it possible to suppress the current copy made by the third transistor, and thus to suppress this third transistor.

Moreover, the device 1 of FIG. 4 makes it possible that a same current I1 is delivered, during each first phase, in the input branch of the mirror comprising the transistor T2 and the circuit C1, and, during each second phase, in the input branch of the current mirror comprising the transistor T3 and the circuit C3. In other words, when the transistors T2 and T3 are identical, it is possible by means of the device 1 of FIG. 4 that a same current I1' is drawn from the node 101 during each first phase, and supplied to the node 101 during each second phase.

In the variant embodiment of FIG. 4, the terminal B31 of the transistor T3 is coupled, preferably connected, to the terminal 109 of the source 107, during each of the first and second phases.

The operation of the device 1 of FIG. 4 is similar or identical to that of the device of FIG. 1 and will not be described in detail again.

Figure 5:
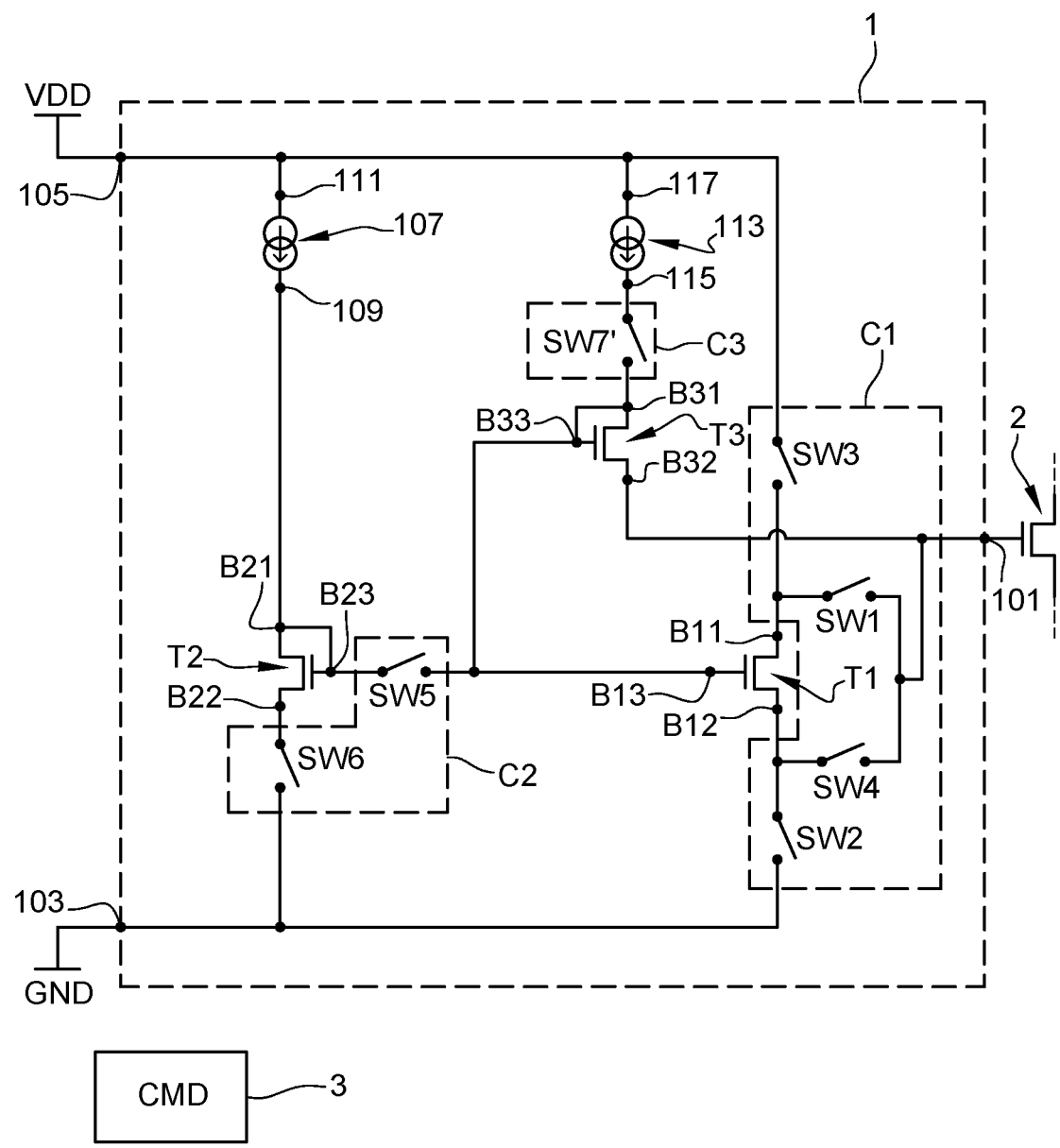
FIG. 5 illustrates, schematically and in the form of a circuit, a further variant embodiment of the device of FIG. 1.

FIG. 5 illustrates, schematically and in the form of a circuit, a further variant embodiment of the device 1 of FIG. 1. Only the differences between the device 1 of FIG. 5 and that of FIG. 1 are highlighted here.

In the device 1 of FIG. 5, as in the device 1 of FIG. 1, the circuit C3 is configured, during each second phase, to couple the transistors T1 and T3 as a current mirror. In particular, the circuit C3 is configured to couple, during each second phase, the control terminal B13 of the transistor T1 to the terminal 115 of the source 113, via the terminal B31 of the transistor T3, and to prevent, during each first phase, the transistor T3 from acting on the control terminal B13 of the transistor 1 and on the output node 101.

However, in the variant embodiment of FIG. 5, the terminal B31 of the transistor T3 is not coupled or connected to the terminal 115 of the source 113 during each of the first and second phases. The circuit C3 is configured here to couple, during each second phase, the terminal B31 to the terminal 115 of the source 113.

In a complementary manner, the circuit C3 is further configured to isolate, during each first phase, the terminal B31 from the terminal 115.

Thus, during each first phase, no current is supplied to the transistor T3. As a result, even if the terminal B32 of the transistor T3 is coupled, preferably connected, to the node 101 during each of the first and second phases as depicted in FIG. 5, the transistor T3 does not act on the node 101 during the first phases. As a further result, even if the terminal B33 of the transistor T3 is coupled, preferably connected, to the terminal B13 during each of the first and second phases as depicted in FIG. 5, the transistor T3 does not act on this terminal during the first phases.

According to a particular embodiment, the circuit C3 comprises a first second-phase switch SW7' connected between the terminal 115 of the source 113 and the terminal B31 of the transistor T3. It will be noted that, like the second-phase switch SW7 described in relation to FIG. 1, the second-phase switch SW7' makes it possible, during each second phase, to connect the terminal B13 of the transistor T1 to the terminal 115 of the source 113, via the terminal B33 (thus the terminal B31) of the transistor T3.

The operation of the device 1 of FIG. 5 is similar to that of the device 1 of FIG. 1 and will not be described in detail again.

It will be noted that the variant embodiment of FIG. 5 can be combined with that of FIG. 4. The implementation of this combination is within the capabilities of those skilled in the art based on the description of these two variants provided above.

The variant embodiment described above for circuit C3 with reference to terminals B31, B32, B33 and 115, node 101 and terminal B13, can be applied to circuit C2 with reference to terminals B21, B22, B23 and 109, node 103 and terminal B13, respectively.

Figure 6:
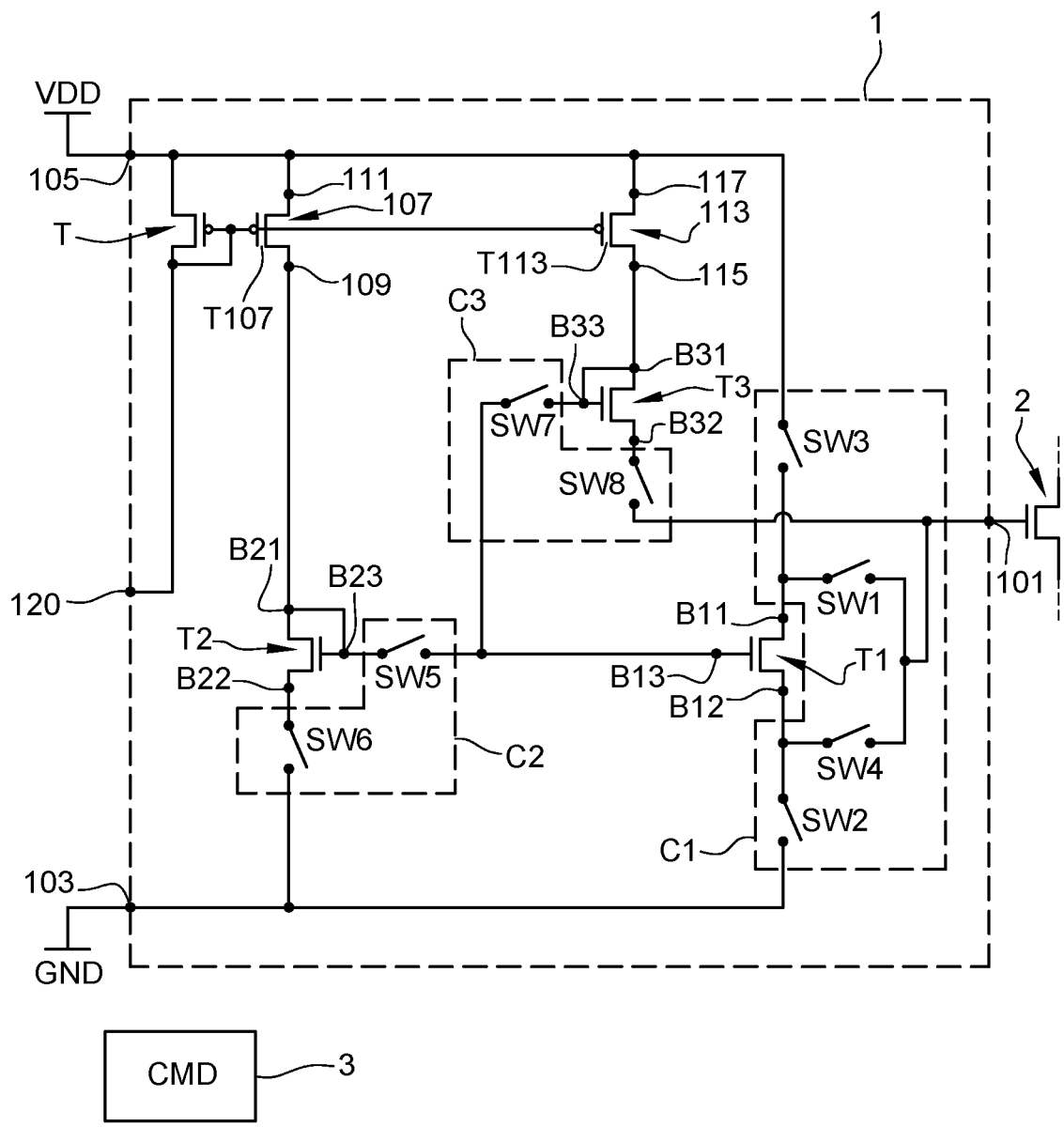
FIG. 6 illustrates, schematically and in the form of a circuit, an example of a more detailed embodiment of the device of FIG. 1.

FIG. 6 illustrates, schematically and in the form of a circuit, an example of a more detailed embodiment of the device 1 of FIG. 1. Only those details not described in relation to FIG. 1 are highlighted here.

In FIG. 6, the current source 107 is implemented by a transistor T107, in this example a MOS transistor, for example an N-channel MOS transistor. The conduction terminals of the transistor T107 correspond to the terminals 109 and 111 of the current source 107. More specifically, in this example, the terminal 111 corresponds to the source of the transistor T107, and the terminal 109 corresponds to the drain of the transistor T107.

The transistor 107 is mirror-assembled with a transistor T, in this example a MOS transistor, for example an N-channel MOS transistor. The transistor T has its conduction terminals, in this example its source and its drain, coupled, preferably connected, respectively to the node 105 and to a node 120 of the device 1. The node 120 is intended to receive a current I. Moreover, the transistor T has one of its conduction terminals, in this example its drain, connected to its control terminal.

Similarly, the current source 113 is implemented by a transistor T113, in this example a MOS transistor, for example an N-channel MOS transistor. The conduction terminals of the transistor T113 correspond to the terminals 115 and 117 of the current source 113. More specifically, in this example, the terminal 117 corresponds to the source of the transistor T113, and the terminal 115 corresponds to the drain of the transistor T113.

In this example, the transistor T113 is, like the transistor T107, mirror-assembled with the transistor T. In a further example not depicted, the transistor T113 is mirror-assembled with a transistor other than the transistor T, this other transistor potentially having one of its conduction terminals coupled, preferably connected, to a further node intended to receive a current.

During operation, the current I is supplied to the node 120 and the transistors T107 and T113 thus supply, according to the phase of operation in question, the current I1 and the current I2. The currents I1 and I2 are proportional to the current I, for example substantially equal, preferably equal to the current I.

Although it has not been illustrated here, the node 120 can correspond to a conduction terminal of a transistor, for example a, for example P-channel, MOS transistor, the latter potentially being mirror-assembled with a further transistor.

Those skilled in the art are capable of adapting the detailed example of the device 1 described in relation to FIG. 6 to the various variants described in the foregoing.

The inventor noticed that a device 1, for example of the same type as the device of FIG. 6, can have a surface area 30% smaller than a similar device in which: the circuits C1, C2 and C3 are omitted, the terminals B21 and B22 are connected respectively to the terminal 109 and to the node 103, a first transistor T1 has its conduction terminals connected to the respective nodes 101 and 103, and is mirror-assembled with the transistor T2, the terminals B21 and B22 are connected respectively to the terminal 115 and to the node 101, and a second transistor T1 has its conduction terminals connected to the respective nodes 105 and 101, and is mirror-assembled with the transistor T3.

Although embodiments and variants have been described above, in relation to FIGS. 1 to 6, in which the transistor T1 of the output branch of the current mirror is mirror-assembled with the transistor T2 during each first phase, and to mirror the transistor T3 during each second, by means of the circuit C1 and the circuits C2 and C3 associated with the respective transistors T2 and T3, these embodiments and variants can be adapted to cases where the transistor T1 is mounted as a current mirror of the transistor T2 during each first phase and as a current mirror of the same transistor T2 during each second phase, in particular by modifying the circuit C2, which makes it possible to eliminate the transistor T3 and the circuit C3. For example, the circuit C2 is thus configured as follows: to connect the terminal B22 of the transistor T2 to the node 103 during each first phase, for example by means of a first-phase switch, to connect this terminal B22 to the node 101 during each second phase, for example by means of a second-phase switch, and to connect the terminal B21 to the terminal 109 during each first phase, for example by means of a further first-phase switch, and to the terminal 115 during each second phase, for example by means of a further second-phase switch, the terminal B23 being connected to the terminal B13 regardless of the phase in question. It should be noted that if the sources 107 and 113 are combined, the terminal B21 is thus coupled, preferably connected, to the terminal 109 regardless of the phase of operation in question.

Various embodiments and variants have been described. Those skilled in the art will understand that certain features of these embodiments can be combined and other variants will readily occur to those skilled in the art. In particular, those skilled in the art are capable of adapting the described example embodiments and variants to cases where the transistors T1, T2 and T3 are P-channel transistors, in particular by modifying the N or P type of the other transistors of the device 1 such that the transistors which allow to implement the first- and second-phase switches.

Finally, the practical implementation of the embodiments and variants described herein is within the capabilities of those skilled in the art based on the functional description provided hereinabove. In particular, those skilled in the art are capable, based on the above description, of determining the dimensions of the transistors T1, T2 and T3, and the first- and second-phase switches of the circuit C1, in particular when the latter are implemented by transistors of the same technology as the transistor T1, in order to obtain a device which is more compact than known devices and with which it is possible to obtain, depending on the target application, desired values for currents respectively supplied to the node 101 and drawn from the node 101, with the precision required for these current values.

The invention claimed is:

1. A device configured to operate in alternating first and second phases of operation, the device comprising:
a first transistor; and
a first circuit configured to:
couple a first conduction terminal of the first transistor to an output node of the device and couple a second conduction terminal of the first transistor to a first node of application of a first potential during each first phase of the alternating first and second phases of operation; and
couple the first terminal of the first transistor to a second node of application of a second potential different from the first potential and couple the second conduction terminal of the first transistor to the output node during each second phase of the alternating first and second phases of operation.

2. The device according to claim 1, wherein the first circuit comprises:
a first switch connected between the first terminal of the first transistor and the output node;
a second switch connected between the second terminal of the first transistor and the first node;
a third switch connected between the first terminal of the first transistor and the second node; and
a fourth switch connected between the second terminal of the first transistor and the output node.

3. The device according to claim 2, wherein the first transistor and the first, second, third and fourth switches of the first circuit are MOS transistors, and wherein a channel length of the first transistor is greater than a minimum channel length for an integrated circuit fabrication technology used to make the first transistor, and wherein a channel length of the first, second, third and fourth switches of the first circuit is equal to said minimum channel length.

4. The device according to claim 3, wherein the channel length of the first transistor is at least 4 times greater than the minimum channel length.

5. The device according to claim 2, wherein the first and second switches are closed during each first phase of the alternating first and second phases of operation, and wherein the third and fourth switches are closed during each second phase of the alternating first and second phases of operation.

6. The device according to claim 1, further comprising:
a second transistor having a first conduction terminal and a control terminal that are connected with each other;
a third transistor having a first conduction terminal and a control terminal that are connected with each other;
a second circuit configured to couple, during each first phase of operation, a control terminal of the first transistor to a first terminal of a source of a first current via the first terminal of the second transistor;
wherein a second terminal of the source of the first current is coupled to the second node; and
a third circuit configured to couple, during each second phase of operation, the control terminal of the first transistor to the first terminal of the source of the first current via the first terminal of the third transistor.

7. The device according to claim 6, wherein a ratio of a channel width to the channel length of the first transistor is equal to N times a ratio of the channel width to the channel length of the second transistor and to M times a ratio of the channel width to the channel length of the third transistor, with N and M greater than or equal to 10, M preferably being equal to N.

8. The device according to claim 1, further comprising:
a second transistor having a first conduction terminal and a control terminal that are connected with each other;
a third transistor having a first conduction terminal and a control terminal that are connected with each other;
a second circuit configured to couple, during each first phase of operation, a control terminal of the first transistor to a first terminal of a source of a first current via the first terminal of the second transistor;
wherein a second terminal of the source of the first current is coupled to the second node; and
a third circuit configured to couple, during each second phase of operation, the control terminal of the first transistor to a first terminal of a source of a second current via the first terminal of the third transistor;
wherein a second terminal of the source of the second current is coupled to the second node;
wherein the second current is equal to the first current.

9. The device according to claim 8, wherein:
the second circuit comprises a first switch configured to couple, during each first phase of operation, the control terminal of the first transistor to the first terminal of the source of the first current via the first terminal of the second transistor;
wherein a terminal of said first switch is coupled to the control terminal of the second transistor; and
the third circuit comprises a second switch configured to couple, during each second phase of operation, the control terminal of the first transistor to the first terminal of the source of the second current via the first terminal of the third transistor;
wherein a terminal of said second switch is coupled to the control terminal of the third transistor.

10. The device according to claim 9, wherein the second circuit is further configured to couple a second conduction terminal of the second transistor to the first node during each first phase of operation.

11. The device according to claim 9, wherein the third circuit is further configured to couple a second conduction terminal of the third transistor to the output node during each second phase of operation.

12. The device according to claim 9, wherein the second circuit further comprises a third switch connected between the second conduction terminal of the second transistor and the first node and actuated during each first phase of operation.

13. The device according to claim 9, wherein the third circuit further comprises a fourth switch connected between the second terminal of the third transistor and the output node and actuated during each second phase of operation.

14. The device according to claim 1, further comprising a current mirror, wherein an output branch of the current mirror is comprised of the first transistor and the first circuit.

15. The device according to claim 14, further comprising:
a second transistor having a first conduction terminal and a control terminal that are connected with each other;
a third transistor having a first conduction terminal and a control terminal that are connected with each other;
a second circuit configured to couple, during each first phase of operation, a control terminal of the first transistor to a first terminal of a source of a first current, via the first terminal of the second transistor;
wherein a second terminal of the source of the first current is coupled to the second node;
a third circuit configured to couple, during each second phase of operation, the control terminal of the first transistor to the first terminal of the source of the first current via the first terminal of the third transistor;
wherein an input branch of the current mirror comprises the second transistor and the second circuit during each first phase of operation; and
wherein said input branch of the current mirror comprises the third transistor and the third circuit during each second phase of operation.

16. The device according to claim 1, configured to draw a first output current from the output node during each first phase, and supply a second output current to the output node during each second phase.

17. The device according to claim 1, wherein the first circuit comprises:
a first switch connected between the first terminal of the first transistor and the output node;
a second switch connected between the second terminal of the first transistor and the first node;
a third switch connected between the first terminal of the first transistor and the second node; and
a fourth switch connected between the second terminal of the first transistor and the output node;
further comprising a control circuit configured to:
control the closing of the first and second switches and the opening of the third and fourth switches during each first phase of operation; and
control the closing of the third and fourth switches and the opening of the first and second switches during each second phase of operation.

18. The device according to claim 1, configured for charging and discharging gate-source and gate-drain capacitors of a MOS power transistor having a gate configured to be connected to the output node.

19. An integrated circuit comprising a device according to claim 1.

* * * * *